United States Patent [19]

Pinneo

[11] Patent Number: 5,015,528

[45] Date of Patent: May 14, 1991

[54] FLUIDIZED BED DIAMOND PARTICLE GROWTH

[75] Inventor: John M. Pinneo, Woodside, Calif.

[73] Assignee: Crystallume, Menlo Park, Calif.

[21] Appl. No.: 171,720

[22] Filed: Mar. 22, 1988

Related U.S. Application Data

[63] Continuation-in-part of Ser. No. 32,415, Mar. 30, 1987, abandoned.

[51] Int. Cl.$^5$ .............................................. C30B 29/04
[52] U.S. Cl. ................................. 428/403; 428/408; 501/86; 423/446
[58] Field of Search .................. 428/15, 403, 405, 408, 428/704; 423/446; 501/86; 51/307, 309; 427/213, 215

[56] References Cited

U.S. PATENT DOCUMENTS

| | | | |
|---|---|---|---|
| 2,941,248 | 6/1960 | Hall | 425/77 |
| 2,947,608 | 8/1960 | Hall | 423/446 |
| 2,947,609 | 8/1960 | Strong | 423/446 |
| 2,947,610 | 8/1960 | Hall et al. | 423/446 |
| 2,947,611 | 8/1960 | Bundy | 423/446 |
| 3,030,187 | 4/1962 | Eversole | 423/446 |
| 3,030,188 | 4/1962 | Eversole | 423/446 |
| 3,142,539 | 7/1964 | Brinkman et al. | 423/446 |
| 3,175,885 | 3/1965 | Brinkman et al. | 423/446 |
| 3,371,996 | 3/1968 | Hibshman | 423/446 |
| 3,520,667 | 7/1970 | Taylor | 427/215 |
| 3,617,347 | 11/1971 | Kuratomi | 427/215 |
| 3,630,677 | 12/1971 | Angus | 423/446 |
| 3,630,678 | 12/1971 | Gardner | 423/446 |
| 3,630,679 | 12/1971 | Angus | 423/446 |
| 3,661,526 | 5/1972 | Angus et al. | 423/446 |
| 3,705,937 | 12/1972 | Dzevitsky et al. | 423/446 |
| 3,714,334 | 1/1973 | Vickery | 423/446 |
| 4,104,441 | 8/1978 | Fedoseev | 428/408 |
| 4,228,142 | 10/1980 | Holcombe, Jr. et al. | 423/449 |
| 4,352,787 | 10/1982 | French et al. | 423/445 |
| 4,606,738 | 8/1986 | Hayden | 51/295 |
| 4,859,493 | 8/1989 | Lemelson | 427/45.1 |
| 4,902,652 | 2/1990 | Kume et al. | 501/90 |

FOREIGN PATENT DOCUMENTS

| | | |
|---|---|---|
| 135117A | 8/1983 | Japan . |
| 231498A | 10/1985 | Japan . |
| 1151097 | 7/1986 | Japan . |
| 665472 | 1/1952 | United Kingdom . |

OTHER PUBLICATIONS

Patel: *Indian Journal of Pure & Applied Physics*, "Crystallization of Diamond at Atmospheric Pressure", (vol. 19, 9/81, pp. 803–820).
Burton, *Nature*, 8/24/05, p. 397 (No. 1869, vol. 72).

*Primary Examiner*—George F. Lesmes
*Assistant Examiner*—Christopher Brown
*Attorney, Agent, or Firm*—Kenneth D'Alessandro

[57] ABSTRACT

A process is provided for forming synthetic diamond by vapor deposition of a carbon gas source in the presence of atomic hydrogen on a substrate contained in a fluidized bed. The diamond may be overcoated by vapor deposition of a non-diamond material.

4 Claims, No Drawings

FLUIDIZED BED DIAMOND PARTICLE GROWTH

This application is a continuation-in-part of copending Ser. No. 032,415 filed Mar. 30, 1987, now abandoned.

The present invention is directed to a rapid, efficient, and economical method for preparing diamond particles or fibers, particles or fibers coated with diamond, and diamond particles or fibers coated with non-diamond materials.

BACKGROUND OF THE INVENTION

Diamond is an allotrope of carbon which is metastable at ordinary pressures, having a large activation energy barrier which prevents conversion to graphite, the more stable allotrope at ordinary temperatures and pressures. In addition to its value as a precious gem, the uses of diamond include many industrial applications such as use in polishing, grinding, sawing and drilling, as windows in high pressure cells, in diamond microtome knives for biological and medicinal uses, as a radiation detector, for temperature measurement, as heat sinks, as wire drawing dyes, styli for photographs and as hardness indenters. Thus numerous approaches have been utilized to attempt to synthesize diamond.

One approach is to utilize high pressure methods since at high pressures diamond is the thermodynamically stable form of carbon rather than graphite. However, heretofore, high pressure methods have met only with limited commercial success since only small diamond crystals have been made, which are suitable mainly for use as abrasives and in forming sintered preforms for use as wire drawing dyes or tool bits. Moreover, the product of high pressure diamond synthesis is often contaminated with impurities of more or less uncontrollable concentration and distribution, rendering such diamond unsuitable for a number of important technical applications.

There have been attempts to grow diamond under low pressure conditions which, at first impression, may seem to be against thermodynamic principles. However, upon crystallization at low pressures using free carbon atoms, the carbon atoms, during their fall from a state of higher free energy, may be made to pause (i.e. crystallize) at the level of diamond, instead of going to graphite. Therefore free carbon atoms with a higher free energy than that in diamond may be made to crystallize as diamond under suitable conditions, thus the metastability of diamond alone is not a deterrent factor of obtaining diamond at atmospheric or reduced pressure conditions. Moreover, metastable phases, such as diamond, may be made to grow in the stability field of another phase, when nucleation and growth is facilitated by providing seeds of the required phase or a substrate which allows epitaxial overgrowth. Thus there are numerous techniques utilizing low pressure epitaxial crystallization of diamond at low gas pressures. However, these gas phase synthesis techniques suffer from the problems of extremely low growth rates and/or the inevitable problem of interruption of growth due to formation of graphite. Once the graphite is formed, being the favored thermodynamic product at low pressure, it overtakes and inhibits further diamond growth. In order to maximize the time available before the appearance of graphite, the vapor pressures of the carbon bearing gas has been usually kept quite low, thus leading to very slow diamond deposition rates, typically about 0.1 micron/hour.

It has only recently been reported that atomic hydrogen is important to epitaxial diamond growth. Pate (Ph.D. thesis, Stanford University, 1984), elucidated the suggestion by Russian workers (Varnin, et al., *Soviet Physics Crystallography* 22(4), pp. 513–515, 1977) that atomic hydrogen, adsorbed on the diamond epitaxial surface, acts to stabilize carbon $sp^3$ bonding (diamond bonding) rather than $sp^2$ bonding (graphitic bonding), thereby favorably altering the kinetics of diamond bond formation carbon atoms and the growing diamond surface. Without atomic hydrogen, or other means of achieving the desired effect of stabilizing or enhancing $sp^3$ bond formation versus $sp^2$ formation, diamond growth by low vapor deposition is relatively inefficient and undesirable graphite deposition occurs rapidly.

Another approach for diamond synthesis has been use of low pressure liquid phase synthesis. Liquid phase synthesis however has not as yet permitted synthesis of large, high quality diamond crystals and the products have been limited to microscopic deposits of uncertain identity. The commercial utility of liquid phase synthesis has been limited by the same problems which affect low pressure vapor phase synthesis, i.e., failure to exclude poison species (such as water), lack of species which stabilize the carbon $sp^3$ bonds (such as atomic hydrogen), and failure to develop process conditions which form high quality crystals at acceptable rates of growth.

There are many processes known in the art in which diamond is synthesized under high pressure at which diamond is the thermodynamically stable form of carbon. Although there are many variations of this technique, a typical technique involves use of a suitable carbon solvent such as a transition metal alloy, and a carbon source which are compressed and heated in an apparatus capable of providing pressures of at least 60 kilobars at temperatures above 1500° C. The carbon is dissolved, transported, and deposited as diamond crystals but the carbon transport rate is governed primarily by diffusion, and therefore is very low. Thus the growth rates are slow and long deposition times are required to grow large diamonds. Furthermore because of the high pressures and temperatures required, the apparatus is necessarily bulky, expensive and because of the relatively small active of volume, precludes effective use of mechanical techniques (such as stirring) which might improve growth rates and product quality.

A fluidized bed has been utilized for vapor deposition of silicon by Hsu, et al. (NASA Tech. Briefs, Summer 1985, pp. 98–99; Fall 1985, p. 96). In the process described, coproduction of up to about 10% silicon fines occurred with the desired larger silicon particles. However, in the deposition of diamond, the production of undesired graphite at a 10% level would be unacceptable. Therefore, the specific method utilized for silicon deposition disclosed by Hsu is not believed to be practically useful for efficiently preparing synthetic diamond.

It is an object of the present invention to provide a vapor phase metastable diamond synthesis in a fluidized bed.

It is another object of the present invention to provide a method for vapor phase metastable diamond synthesis in a fluidized bed utilizing a carbon source gas and atomic hydrogen to improve deposition of diamond.

It is yet another object of the invention to provide diamond substrates over which may be deposited non-diamond materials.

These and other objects of the present invention will be apparent to those skilled in the art from the following description of the preferred embodiments and from the appended claims.

SUMMARY OF THE INVENTION

The present invention provides a method for forming synthetic diamond by vapor deposition from a gaseous carbon source onto a substrate, comprising the step of contacting said carbon source gas in the presence of atomic hydrogen with a fluidized bed comprising said substrate under conditions whereby diamond is epitaxially deposited onto said substrate.

The fluidized bed may be provided by the flow of gases including the flow of the gaseous carbon source gas; by vibration of the particles in the bed; by introducing the substrate into an electric field oriented to electrostatically levitate the substrate or by other methods for maintaining the substrate in constant fluidized motion.

In another embodiment of the invention, diamond substrates, which may either be diamond seed particles or diamond made according to the present invention, are used in a fluidized bed and appropriate feed vapors are contacted with the bed under chemical vapor deposition conditions to deposit non-diamond materials over the diamond substrate. For example, silane and ammonia may be used to deposit silicon nitride coatings by CVD to form silicon nitride-surfaced particles. Other suitable coating materials for deposition upon particulate diamond substrate include silicon and other non-diamond component or dopant materials, including but not limited to germanium, phosphorous, boron, arsenic, nitrogen, aluminum, gallium, and the like, as well as metals and ceramics. The choice of coating material selected depends upon the application for which the coated substrate is to be used.

By the processes according to the invention diamond-containing materials are obtained which have advantageous applications.

A particular advantage of the present invention is the ability to attain a deposition rate of diamond substantially free of graphite at a rate of up to about 20 microns/hour; and particularly at the rate of from 1 to 5 microns/hour.

DETAILED DESCRIPTION OF THE PREFERRED EMBODIMENTS

The present invention is directed to a method for forming synthetic diamond by vapor deposition utilizing a fluidized bed wherein the fluidized bed comprises seed particles. The seed particles may be diamond, silicon carbide, silicon, silicon nitride, aluminum oxide, aluminum nitride, boron nitride, beryllium oxide, zirconium oxide, or any other material upon which diamond may be epitaxially deposited by chemical vapor deposition.

The term diamond in the following context will have its normal meaning, that is, a substantially transparent hard, strong allotrope of carbon consisting of $sp^3$-bonded carbon atoms which is thermodynamically stable at elevated pressures. As used herein, the term diamond is also intended to encompass $sp^3$-bonded carbon such as Lonsdaleite, as well as other polytypes and allotypes of carbon which have properties similar to those of $sp^3$-bonded carbon.

In one embodiment, according to the present invention a fluidized bed is first used comprising seed particles in the form of grains, fibers (including fibrous forms known in the art as whiskers), or other shapes, for epitaxial diamond deposition. The seed particles may be diamond particles, or other types of particles which may form a substrate for epitaxial diamond deposition, such as silicon carbide or silicon. The fluidized bed will be subjected to conditions of diamond deposition using a low pressure carbon source gas, for example, under conditions typically known in the art as plasma enhanced chemical vapor deposition (PECVD). Low pressure growth of diamonds on seed crystals typically occur at pressures of $10^{-2}$ to $10^3$ torr at temperatures ranging from about 800° to 1450° C., such as disclosed in U.S. Pat. Nos. 3,630,678 and 3,030,188. Typical carbon source gases are methane, ethane, and chlorinated hydrocarbons such as dichloromethane, chloroform, and carbon tetrachloride. Typical conditions include carbon source gas pressures in the range of about 1 to $10^2$ torr and temperatures from about 600° to 900° C. Particularly preferred conditions include carbon source gas pressures of from 10 to 50 torr and temperatures of from 600° to 850° C. The most preferable conditions include a temperature of 800° C., with carbon source pressures of 25 torr.

It is also essential to the operation of the present invention that there be a source of atomic hydrogen, or other way of promoting $sp^3$ carbon bonding on the substrate surface in the fluidized bed. Atomic hydrogen may be provided by dissociating molecular hydrogen in the chemical vapor deposition stream. This may be accomplished by applying non-thermal energy to the fluidized bed to cause dissociation of molecular hydrogen into atomic hydrogen. The non-thermal energy may be provided by resistive, inductive, radiant or other sources of energy which produce the required temperature within the fluidized bed. Means of producing atomic hydrogen include, but are not limited to, electric discharges (initiated and/or sustained by direct current), low frequency alternating current, radio frequency radiation, microwave radiation, ultraviolet radiation, thermal means, penetrating radiation such as x-rays, gamma rays, alpha rays, beta rays, or neutron radiation.

Application of such non-thermal sources of energy is preferably made as the gas mixture flows into the fluidized bed. Alternatively, the atomic hydrogen may be provided by substantially non-thermal dissociation of molecular hydrogen upon a catalytic matrix. This may be accomplished, for example, by directing molecular hydrogen onto a catalytic surface, such as platinum, with the catalytic material having a sufficient depth such that the molecular hydrogen enters into and passes through the catalytic matrix and appears on the other side of the catalytic material as atomic hydrogen. Many such catalytic materials may be utilized which are known from the art of hydrogenation, such as platinum, palladium, nickel, Raney nickel, lead, and other hydrogenation catalysts. The preferred catalytic matrix for dissociating molecular hydrogen to atomic hydrogen for the present invention is palladium. The flowing gas mixture may also comprise an appropriate inert gas such as helium to modify ionization thresholds and/or deposition kinetics, as desired, and to optimize the deposition parameters.

Methods for enhancing the mobility of carbon atoms on the particle surfaces may be utilized in conjunction with the use of atomic hydrogen as described above. Atomic carbon mobility-enhancing agents include, but are not limited to, gases such as chlorine, metallic species such as nickel, iron, platinum and radiation such as UV light of a wavelength and intensity sufficient to increase surface atomic mobility. It will be recognized that the use of such agents may cause impurities to be incorporated into the diamond particles, but in some instances, such impurities, as dopants, may be desirable to impart semiconductor or other desired properties to the diamond.

The bed of seed particles may be fluidized by the flow of gases comprising the gaseous carbon source. Other components of the fluidizing gas may be a carrier gas, such as helium, and molecular hydrogen which provides a source of atomic hydrogen as described above. Other methods of fluidizing the bed of seed particles may be utilized such as by applying a vibrating force to the bed or by introducing the particulate substrate into an electric field oriented to levitate the particles by electrostatic force. Apparatus and methods for maintaining a fluidized bed by flowing gases, vibration, and electrostatic levitation in general are known in the catalytic fluidized bed art. By using low pressure chemical vapor deposition methods for depositing diamond in a fluidized bed in accordance with the present invention, diamond deposition rates in general from about 6 nm/hour to 20 microns/hour may be achieved and in particular deposition rates of from 1 to 5 microns/hour may be achieved without substantial formation of graphite. This is believed to be an advantage over methods of forming synthetic diamond by chemical vapor deposition heretofore known in the art.

Other gases may be utilized in the deposition stream to impart a dopant into the diamond, particularly if semiconductor properties are desired. For example, diborane may be incorporated into the gas stream to provide a boron dopant in the diamond crystal.

The deposition process according to the present invention may be conducted as a batch process whereby the deposition is continued until the desired particle size distribution is produced, at which time the carbon source gas flow is terminated and the product is cooled.

Alternatively, the process may be conducted as a continuous process when combined with the sorting and removing of the particles as they reach a selected size limit. Methods for sorting include the use of a chamber containing the fluidized bed having tapering walls which produce variation in gas flow velocity whereby particles of different sizes are carried to different areas of the chamber in a predictable way where they may be continuously drawn out of the chamber.

Subsequent to deposition of diamond, the reactive feed vapors flowing into the fluidized bed may be changed from carbon and atomic hydrogen sources to other feeds which result in deposition of non-diamond materials by CVD. The methods and materials for CVD deposition of non-diamond materials such as, silicon nitride and other nitrides, amorphous silicon, silicon carbide, boron, boron nitride, aluminum nitride, aluminum oxide, beryllium oxide, zirconium oxide, phosphorous and various phosphides, and other metals, ceramics or inorganic materials, are known and may be accomplished by using appropriate feed gases into the fluidized bed, such as, silane, higher silanes, ammonia, nitrogen, borane and higher boranes, as well as mixtures of these with a carbon source gas to form carbides. Thus, coated substrates may be produced which include semiconductors, photovoltaic particles, fusion target pellets, high tolerance bearings and protective overcoatings such as passivation layers ($SiN_2$). Particularly advantageous uses of particles comprising diamond having a non-diamond overcoating are in the production of structural materials with high temperature tolerance. For example, silicon-nitride coated diamond particles made according to the present invention may be fused or bonded into structural parts having advantageous thermal-resistance and structural integrity for use on the exterior of satellites or missiles. Silicon-nitride-coated diamond particles are also advantageous as long-lived abrasives for surfacing cutting tools. Ceramic-coated diamond particles are useful as packaged microchips, for example as semiconductor chips, overcoated with diamond, then overcoated with a ceramic such as alumina, beryllia, or aluminum nitride.

It will be appreciated that the starting particulate diamond materials may not only be provided by the fluidized bed diamond deposition process according to the present invention, but that particulate diamond from any source may be utilized.

In a particularly preferred embodiment, the initial substrate will be provided as a fiber or, as is known in the art, as a whisker, and placed in a fluidized bed reaction chamber under conditions for diamond deposition as described hereinabove. This produces a novel and advantageous material which is a whisker material which has an outer shell or film of diamond with a core of substrate material. This material is useful as reinforcing elements in a variety of structural composites, such as reinforced aluminum, titanium, and plastics of many types, taking the place of conventional graphite reinforcement fibers. If desired, the diamond whiskers may be overcoated with a nondiamond coating, such as silicon nitride, silicon carbide, or other suitable material, to provide diamond whiskers with a protective surface to confer desirable properties as oxidation resistance at elevated temperatures.

EXAMPLE 1

One kilogram of diamond dust consisting of particles having a mean diameter of 1 micron is placed in an apparatus which permits the flow of gas through the particulate mass, producing a fluidized bed of diamond particles with the surface of each particle being exposed to the flowing gas. The fluidized bed of particles is heated to a nominal temperature of 650° C. The fluidizing gas stream contains a source of carbon, and a significant concentration of atomic hydrogen. Flow rates and pressures are adjusted to produce an average diamond deposition rate of 6 nanometers per hour. After 100 hours, a mass in excess of 10 kilograms of diamond particles is produced, with the particles having a mean diameter of 2.2 microns.

EXAMPLE 2

One kilogram of diamond dust consisting of particles having a mean diameter of 10 microns is treated as described in Example 1. Flow rates and pressures are adjusted to produce an average diamond deposition rate of 60 nanometers per hour. After 100 hours, a mass in excess of 10 kilograms of diamond particles is produced, with the particles having a mean diameter of 22 microns.

EXAMPLE 3

One kilogram of diamond dust consisting of particles having a mean diameter of 100 microns is treated as described in Example 1. Flow rates and pressures are adjusted to produce an average diamond deposition rate of 600 nanometers per hour. After 100 hours, a mass in excess of 10 kilograms of diamond particles is produced, with the particles having a mean diameter of 220 microns.

EXAMPLE 4

The growth conditions are arranged as in Example 1, except that the substrate consists of silicon carbide particles with an average diameter of 1 micron. At the end of the growth cycle, a mass in excess of 10 kilograms is produced, each individual particle consisting of a silicon carbide core with an overlayer of diamond.

EXAMPLE 5

The growth conditions are arranged as in Example 1, and a dopant source gas (i.e., diborane) is introduced into the gas flow such that its concentration is about 0.% of the total gas flow. At the end of the growth cycle, a mass of particles in excess of 10 kilograms is produced, with the particles containing a measurable incorporated amount of the dopant (boron).

EXAMPLE 6

The growth conditions are arranged as in Example 1, and provision is made for the admission of diborane and ammonia to permit the co-deposition with diamond of cubic boron nitride (CBN), the concentrations of these gases being varied as required to give the desired compositional mixture of diamond/CBN in the material deposited on substrate particles.

EXAMPLE 7

The growth conditions are arranged as in Example 1, except that the fluidized bed is initially loaded with silicon carbide whiskers. The resulting diamond whiskers may be incorporated into plastics for reinforcement, while retaining transparency to electromagnetic radiation.

EXAMPLE 8

The diamond particles produced as described in Example 1 are retained in the fluidized bed reactor and the fluidizing feed gases are changed to silane, hydrogen and ammonia in an argon diluent. Silicon nitride is thus deposited over the diamond to provide silicon nitride-coated diamond which may be fused into thermally-resistant structural elements.

Having described the above preferred embodiments it will be apparent to those skilled in the art that various modifications and alterations may be made without departing from the spirit and scope of the invention, which modifications and alterations are intended to be within the scope of the present invention. The present invention is not deemed to be limited by any of the foregoing description except as described by the following claims.

What is claimed is:

1. A composition comprising diamond-containing particles, said particles comprising a synthetic diamond core and an outer layer of a non-diamond material selected from the group consisting of silicon nitride, silicon, boron nitride, aluminum nitride, aluminum oxide, beryllium oxide and zirconium oxide.

2. A composition according to claim 1 wherein said non-diamond material comprises boron nitride.

3. A composition according to claim 1 wherein said non-diamond material comprises aluminum nitride.

4. A composition according to claim 1 wherein said non-diamond material is selected from the group consisting of silicon nitride, aluminum oxide and zirconium oxide.

* * * * *